(12) United States Patent
McCann et al.

(10) Patent No.: US 8,073,973 B2
(45) Date of Patent: Dec. 6, 2011

(54) METHOD OF PROCESSING DATA PACKETS

(75) Inventors: Stephen McCann, Southampton (GB); Mark West, Southampton (GB); Robert Hancock, Southampton (GB)

(73) Assignee: Siemens Aktiengesellschaft, Munich (DE)

(*) Notice: Subject to any disclaimer, the term of this patent is extended or adjusted under 35 U.S.C. 154(b) by 2252 days.

(21) Appl. No.: 10/381,717

(22) PCT Filed: Sep. 26, 2001

(86) PCT No.: PCT/GB01/04308
§ 371 (c)(1),
(2), (4) Date: Jul. 18, 2003

(87) PCT Pub. No.: WO02/26860
PCT Pub. Date: Apr. 4, 2002

(65) Prior Publication Data
US 2004/0133702 A1   Jul. 8, 2004

(30) Foreign Application Priority Data

Sep. 28, 2000  (GB) .................................. 0023766.9
Jan. 29, 2001  (GB) .................................. 0102158.3

(51) Int. Cl.
*G06F 15/16* (2006.01)
(52) U.S. Cl. ......... 709/247; 709/224; 709/225; 370/477
(58) Field of Classification Search .......... 709/223–225, 709/247; 370/477, 521; 358/1.15; 704/500
See application file for complete search history.

(56) References Cited

U.S. PATENT DOCUMENTS

| 4,689,673 | A |   | 8/1987  | Ohki et al. |
| 5,134,478 | A |   | 7/1992  | Golin |
| 5,293,379 | A | * | 3/1994  | Carr ............................. 370/474 |
| 5,787,253 | A | * | 7/1998  | McCreery et al. ............ 709/231 |
| 5,790,554 | A | * | 8/1998  | Pitcher et al. ................. 370/471 |
| 5,870,479 | A | * | 2/1999  | Feiken et al. ................. 713/160 |
| 5,872,991 | A | * | 2/1999  | Okamoto et al. ............... 712/26 |
| 5,978,386 | A | * | 11/1999 | Hamalainen et al. ......... 370/466 |
| 6,097,794 | A | * | 8/2000  | Suffern et al. ............. 379/93.32 |

(Continued)

FOREIGN PATENT DOCUMENTS

GB         2245797        1/1992

(Continued)

OTHER PUBLICATIONS

M. Degermark, et al., "Low-Loss TCP/IP Hear Comperssion for wireless network" Wireless Networks, vol. 3, No. 5 Oct. 1, 1997, pp. 375-387.*

(Continued)

*Primary Examiner* — Patrice Winder
*Assistant Examiner* — Tauqir Hussain
(74) *Attorney, Agent, or Firm* — Crowell & Moring LLP

(57) ABSTRACT

There is described a method of processing data packets in a data stream in a communication system. In the method, a plurality of data packets from the data stream are analyzed in order to generate profile data which indicates how one or more parts of each of the plurality of data packets varies from data packet to data packet. The profile data is then made available so that a data packet compression scheme that accords with the profile data can be implemented on data packets in the communication system.

18 Claims, 6 Drawing Sheets

U.S. PATENT DOCUMENTS

| | | | |
|---|---|---|---|
| 6,121,903 A * | 9/2000 | Kalkstein | 341/63 |
| 6,134,245 A * | 10/2000 | Scarmalis | 370/474 |
| 6,252,905 B1 * | 6/2001 | Pokrinchak et al. | 375/240.14 |
| 6,370,477 B1 * | 4/2002 | Vermeer | 702/14 |
| 6,408,001 B1 * | 6/2002 | Chuah et al. | 370/392 |
| 6,425,021 B1 * | 7/2002 | Ghodrat et al. | 710/22 |
| 6,542,504 B1 * | 4/2003 | Mahler et al. | 370/392 |
| 6,557,001 B1 * | 4/2003 | Dvir et al. | 707/101 |
| 6,618,506 B1 * | 9/2003 | Auerbach et al. | 382/232 |
| 6,711,164 B1 * | 3/2004 | Le et al. | 370/392 |
| 6,721,333 B1 * | 4/2004 | Milton et al. | 370/469 |
| 6,751,209 B1 * | 6/2004 | Hamiti et al. | 370/349 |
| 6,859,455 B1 * | 2/2005 | Yazdani et al. | 370/392 |
| 6,999,429 B1 * | 2/2006 | Hannu et al. | 370/328 |
| 7,155,493 B1 * | 12/2006 | Weber | 709/218 |
| 7,788,211 B2 * | 8/2010 | Le et al. | 370/252 |
| 2001/0008556 A1 * | 7/2001 | Bauer et al. | 379/265.06 |
| 2002/0026620 A1 * | 2/2002 | Johansson et al. | 714/807 |
| 2002/0114327 A1 * | 8/2002 | Mononen | 370/389 |
| 2004/0133702 A1 * | 7/2004 | McCann et al. | 709/247 |
| 2004/0170198 A1 * | 9/2004 | Meggers et al. | 370/514 |
| 2004/0202167 A1 * | 10/2004 | Jonsson et al. | 370/392 |
| 2005/0195750 A1 * | 9/2005 | Le et al. | 370/252 |

FOREIGN PATENT DOCUMENTS

| | | |
|---|---|---|
| JP | 5136697 | 6/1993 |
| WO | 00/51307 | 8/2000 |
| WO | 01/50705 | 7/2001 |

OTHER PUBLICATIONS

Krister Svanbro, et al., "Wireless Real-time IP Services Enabled by Header Compression" VTC 2000-Spring, 2000 IEEE Vehicular Technology Conference Proceedings, Japan, May 15-18, 2000.

Khiem Le, et al., "Efficient and Robust Header Compression for Real-Time Services" IEEE Wireless Communications and Networking Conference, vol. 2, pp. 924-928.

M. Degermark, et al., "Low-Loss TCP/IP Header Compression for Wireless Networks" Wireless Networks, vol. 3 No. 5, Oct. 1, 1997, pp. 375-387.

* cited by examiner

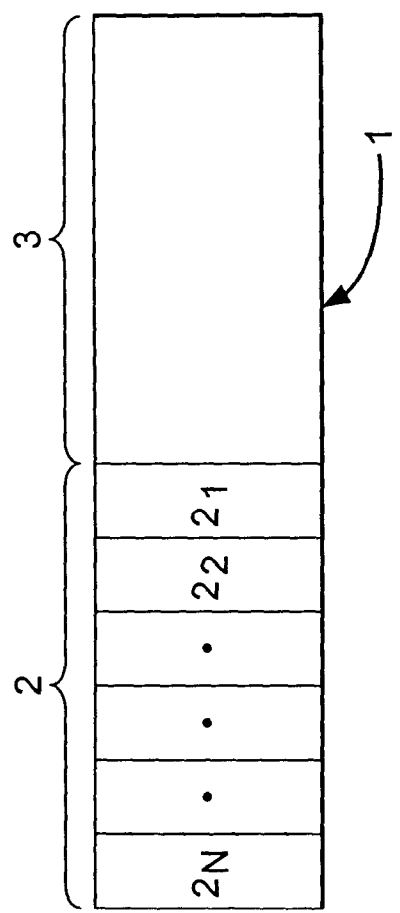

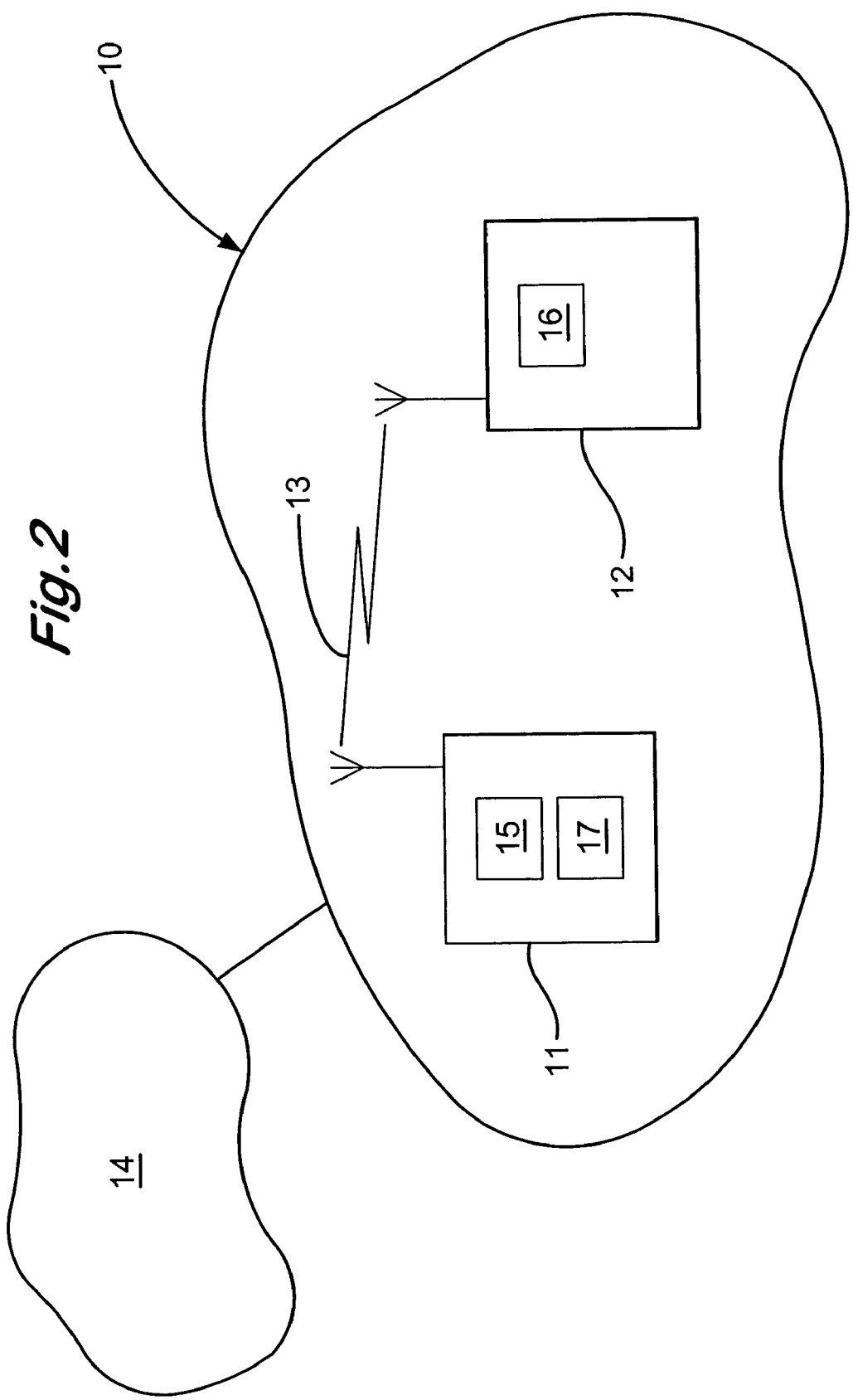

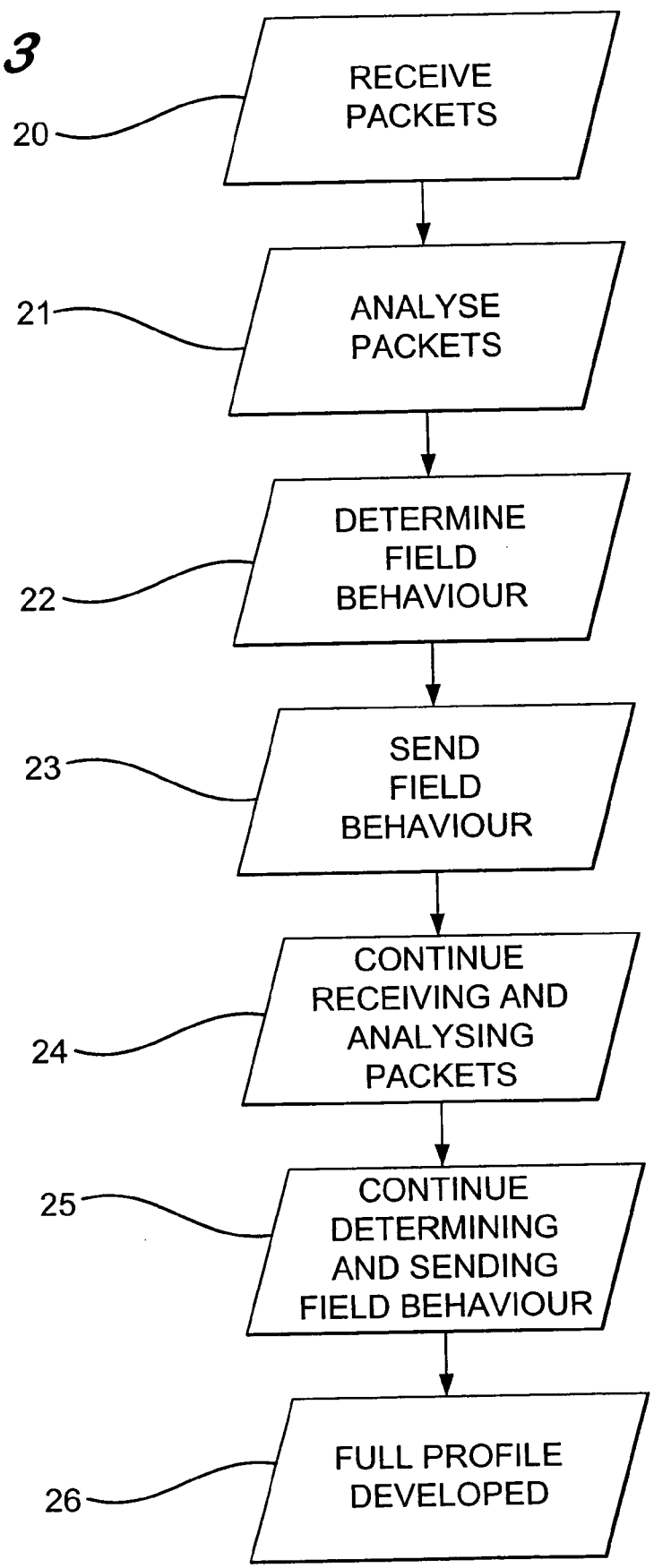

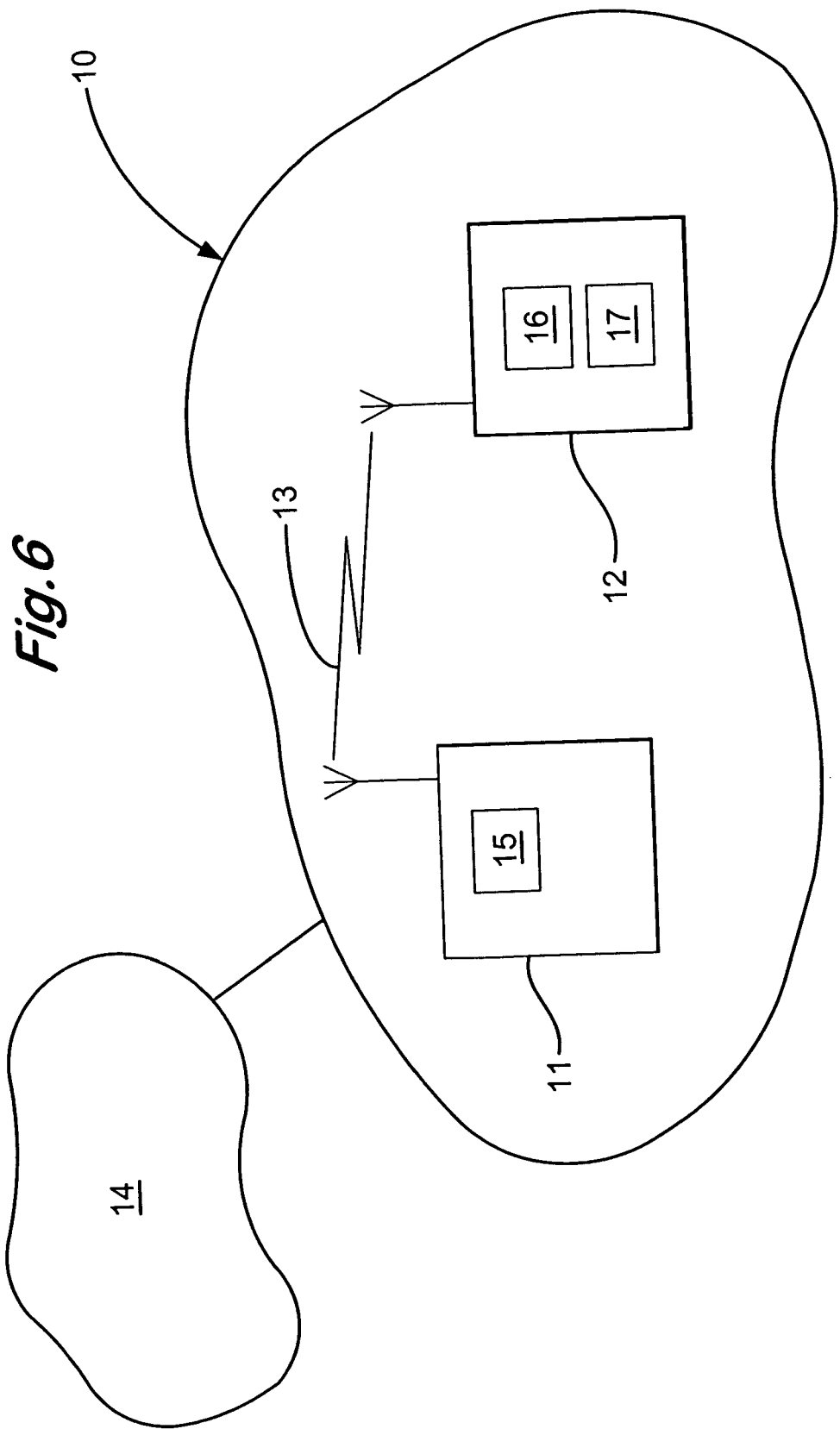

METHOD OF PROCESSING DATA PACKETS

This invention relates to a method of processing data packets.

In many digital communication networks, data is transmitted from a sending station to a receiving station in the form of discrete variable sized portions, commonly referred to as packets. Various communications protocols have been developed which define the procedures for sending packets of data from one station in a network to another station and which also define the procedures that determine how the packets will be processed at the sending and receiving stations. For any communication, there are many functions that may need to be performed by a protocol and in practice there are so many that a set or suite of protocols is used, each protocol in the suite handling one or more specific aspects of the communication. Perhaps the best known protocol suite is the Transmission Control Protocol/Internet Protocol (TCP/IP) which is widely used on the Internet.

A schematic representation of a simple packet 1 is shown in FIG. 1. In common with all packets, the packet 1 can be thought of comprising two parts, a header 2 (also known as the Protocol Control Information (PCI)) and a payload 3 (the actual data to be sent to the receiving node). The header 2 comprises a number of fields, indicated as $2_1$ to $2_N$, each field containing information important to the communication. Examples of fields that a header may comprise are, a 'source field' indicating the address of the sending station, a 'destination field' indicating the address of the receiving station, an 'amount of data field' indicating the size of the payload and an 'identification field' identifying the sequence number of the packet. Many other field types will be known to those skilled in the art.

The protocol suite associated with a particular packet does not define the data carried in the payload part of the packet but it does specify the format of the header, for example, the different types of fields present in the header, the length and ordering of the fields and the way in which the pattern of bits which make up the fields are to be interpreted.

Mobile telecommunications networks and the Internet are converging in terms of their functionality. It is desirable for so called third generation (3G) mobile handsets to be able to deal with Internet data packets directly, to allow mobile users access to seamless e-mail, web browsing, multimedia and other services. Protocols such as TCP/IP have been designed primarily for fixed networks where available bandwidth is relatively more plentiful then that available in wireless networks. When used to carry speech, the message overhead resulting from packet headers can take up to 75% of the total network capacity, which is unacceptable for mobile networks.

To alleviate this problem, various compression schemes have been developed for compressing packet headers prior to the packets being transmitted over the wireless interface. An example of such a scheme is the well known Van Jacobson scheme described in 'RFC 1144'.

In previous header compression systems both the entity that performs the header compression and the entity that performs the subsequent decompression are pre-configured to have access to a stored record of the header profiles of packets associated with any of the known protocol stacks that it is anticipated that the entities may have to deal with.

A header profile is in effect, a definition of how the value of each particular field in the header varies or behaves from packet to packet. For example, a simple header, associated with a notional protocol stack Z may comprise three fields A, B and C and the profile may be 'Field A=static, Field B=irregular and Field C=linear' meaning that the value of field A does not vary from packet to packet, the value of field B varies randomly from packet to packet and the value of field C varies linearly from packet to packet.

Having access to header profiles allows compressors and associated de-compressors to implement compression and subsequent de-compression techniques optimised for the particular protocol suite being used. For example, on receiving packets having headers defined by notional protocol stack Z, knowing the header profile associated with protocol stack Z allows the compressor to implement a compression scheme in which for each packet, Field A is compressed using 'Static Field Encoding', Field B is compressed using 'irregular Field Encoding' and Field C is compressed using 'Linear Field Encoding'. Likewise, knowing the header profile allows a de-compressor to implement an optimised de-compression method.

It is not uncommon for known header compressor/de-compressor systems to be expected to deal with new types of packet data in which the headers are defined by a new protocol stack (or perhaps a variation on an old protocol stack), with which the system has not dealt with before. To do this, the store of header profiles to which the system has access must first be updated with the header profile associated with the new protocol stack.

This is possible, although inconvenient, in network base to base communication, where the profile update can be performed by a network administrator but is more difficult where the communication involves a mobile station, for example, a mobile phone.

The present invention aims to overcome or at least alleviate the above mentioned problems.

According to the invention there is provided a method of processing data packets in a data stream in a communication system, the method comprising: receiving a plurality of data packets; analysing the plurality of data packets; generating in response to the analysis, profile data which indicates how one or more parts of each of the plurality of data packets varies from data packet to data packet; and making the profile data available so that a data packet compression scheme that accords with the profile data can be implemented on data packets in the data stream.

According to the invention there is also provided an apparatus for processing data packets in a communication system, the apparatus comprising: means for receiving a plurality of data packets; means for analysing the plurality of data packets; means for generating in response to the analysis, profile data which indicates how one or more parts of each of the plurality of packets varies from data packet to data packet; and means for making the profile data available for use in selecting a data packet compression scheme that accords with the profile data.

According to the invention there is also provided a system of processing data packets in a data stream in a communication network, the system comprising: receiving a plurality of data packets in the data stream; analysing the plurality of data packets to generate behaviour data that indicates how at least a part of each of the plurality of packets behaves from data packet to data packet; implementing a data packet compression scheme in accordance with the behaviour data on data packets in the data stream.

Embodiments of the present invention will now be described with reference to the accompanying drawings in which:

FIG. 1 is a schematic representation of a packet;

FIG. 2 is a block diagram of a system embodying the invention;

FIG. 3 is a flow diagram illustrating a process used in an embodiment of the invention;

FIG. 4 is a conceptual illustration of a packet profile;

FIG. 5 is a schematic representation of a packet notionally divided into a string of octets;

FIG. 6 is a block diagram of another system embodying the invention;

Figure 7:
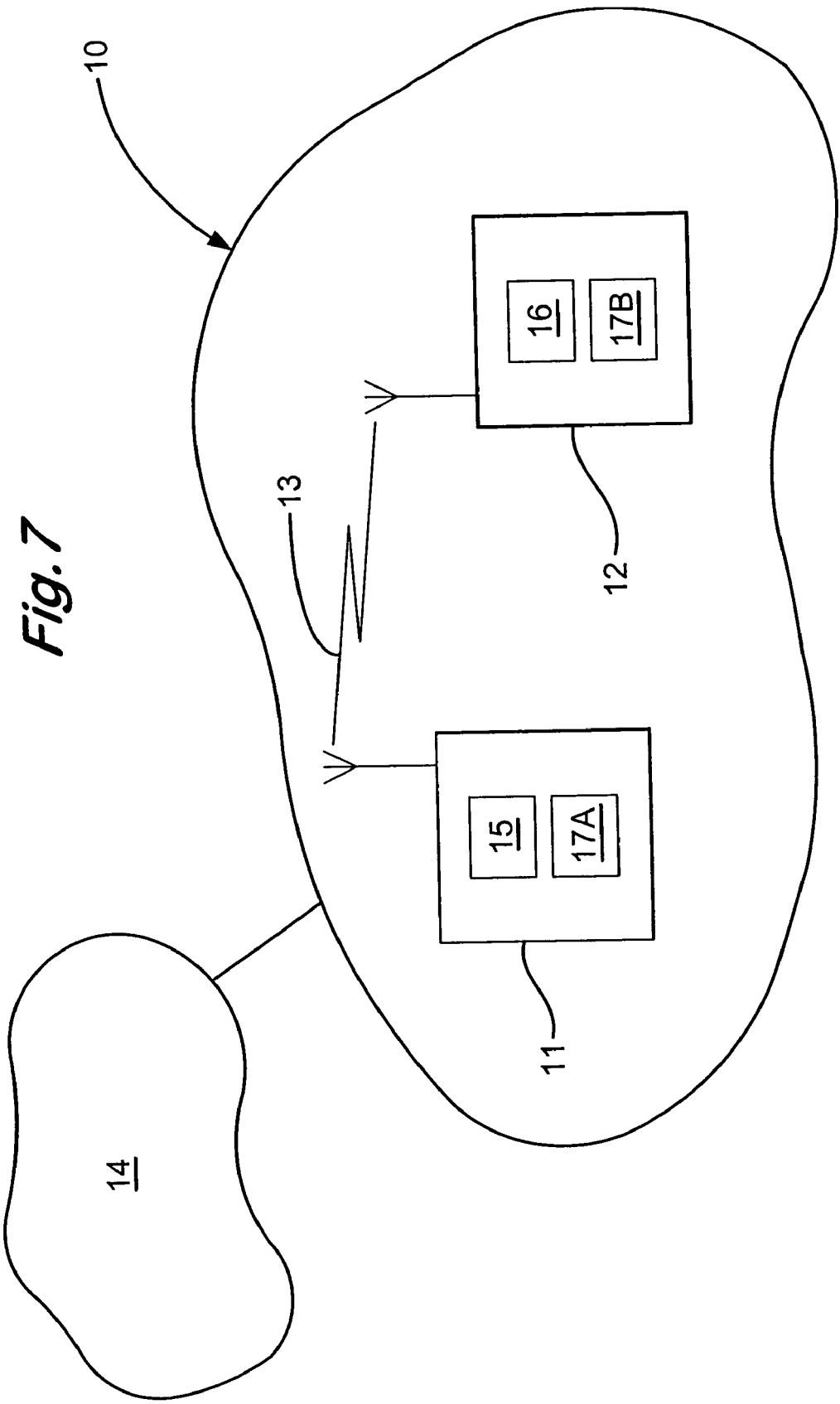
FIG. 7 is a block diagram of another system embodying the invention.

Referring now to FIG. 2 there is illustrated a system embodying the present invention. The system comprises a cellular mobile communication network 10, comprising at least one base station 11 for communicating with at least one mobile station or phone 12 operating in the base station's 11 area of coverage. The mobile network 10 may for example be a GSM network or a UMTS network. The structure and function of the components that make up such networks, for example, mobile stations, base stations, base station controllers, gateways and the like that provide for base station to mobile station communication and which connect the mobile network to other communication networks such as the PSTN or the Internet are well known to those skilled in the art and need not be discussed in any detail here.

Furthermore, as is well known to those skilled in the art, mobile stations may now incorporate hardware/software that enable the station to handle data transmitted to the mobile network in which the mobile station is operating from or via public data networks such as the Internet. The data may take many forms, including for example, voice, video and text data and web pages.

In the embodiment illustrated in FIG. 2, the mobile station 12 receives from the base station 11, via the wireless interface 13, packet data transmitted to the mobile network 10 from the internet 14. The base station 11 is provided with a compressor 15 for compressing received packets prior to the packets being transmitted over the wireless interface 13. The compressor 15 is primarily for compressing packet headers, although it may also compress the packet payloads.

The compressor 15 comprises a program stored at the base station 11 and which is executed on a processor (not shown) present in the base station to compress received packets, prior to them being transmitted to the mobile station 12. As mentioned in the introduction, suitable compression algorithms for compressing packets are well known to those skilled in the art.

Correspondingly, the mobile station 12 is provided with a de-compressor 16, for de-compressing compressed packet received from the base station 11. The de-compressor 16 comprises a programme stored at the mobile station 12 and which is executed on a processor (not shown) present in the mobile station 12 to de-compress the packets. De-compression algorithms for de-compressing packets are well known to those skilled in the art.

The base station 11 is further provided with an entity 17 which for convenience will be referred to hereinbelow as a 'profiler'. The profiler 17 comprises software stored at the base station 11 and executed on a processor (not shown) located in the base station 11. The function of the profiler 17 is to analyse packets in a packet stream intended for the mobile station 12 to identify a profile or pattern of how the value of corresponding bit sequences in different packets behaves from packet to packet. Having identified such behaviour patterns, the profiler 17 sends this information to both the compressor 15 and also the de-compressor 16 to allow these entities to implement an optimal compression/de-compression scheme for the data packets. Thus, unlike in previous systems, the compressor 15 and de-compressor 16 need not have any a priori information about the profile of packets in a given packet stream to enable packet compression and subsequent de-compression to be achieved and are therefore able to deal with arbitrary packet streams.

Referring now to FIG. 3 as well as FIG. 2, an example of a process used in an embodiment of the invention will be given. In this example, the number of fields in each packet, their ordering, and the length of each field is known to the compressor 15 at connection set up. However, the behaviour of corresponding fields from packet to packet is unknown and is to be determined by the profiler 17.

As data packets begin arriving at the base station 11, step 20, the profiler 17 commences analysing the packets to determine how the value of equivalent fields differs from packet to packet, step 21. In step 22, enough packets have been analysed for the profiler to have determined the behaviour of at least one of the fields in the packets, and this information is sent to the compressor 15 and also to the de-compressor 16, step 23. The profiler 17 continues analysing packets as they arrive, step 24, to determine the behaviour of more of the fields, and each time the behaviour of a field is identified, this information is transmitted to the compressor 15 and the de-compressor 16, step 25. This process continues, step 26, until eventually the profiler 17 has developed a full profile of the received packets, in other words, information on the behavioural pattern of each field in the packets.

A conceptual illustration of a packet profile is shown in FIG. 4. For each field in the packet, the profile indicates the size of the field and how the field varies from packet to packet. In the above example, the compressor has prior knowledge of the size of each field and so the profiler 17 need only determine the behaviour of each field.

Figure 8:
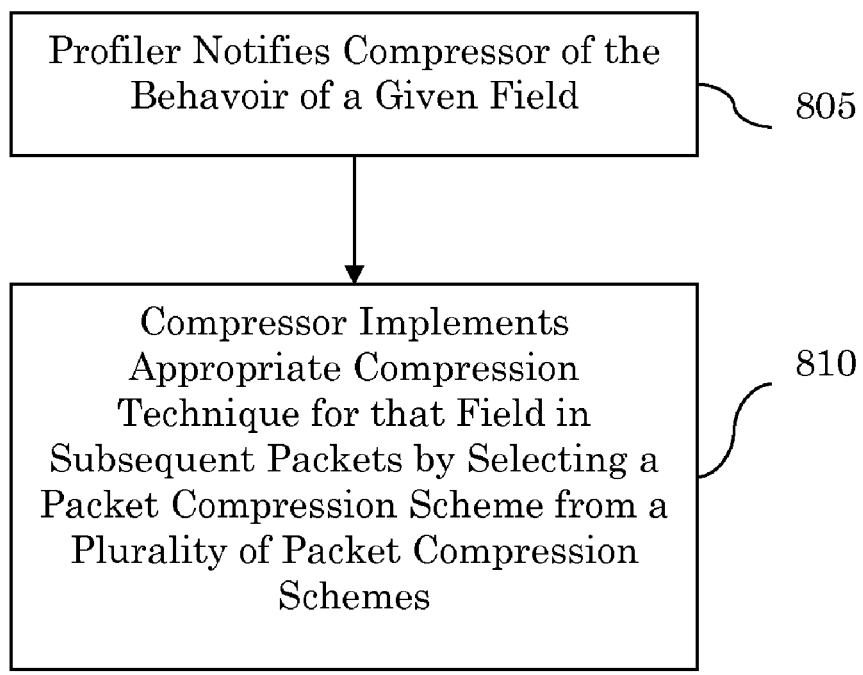
FIG. 8 is a flow diagram illustrating a process used in an embodiment of the invention.

The packets received at the base station 11 may have a number of fields that will either, remain static for the duration of the call connection, change in a predictable fashion, for example a linear fashion, for the duration of the connection or change irregularly for the duration of the connection. As illustrated in FIG. 8, each time the profiler 17 notifies the compressor 15 of the behaviour of a given field (step 805), the compressor 15 is then able to implement an appropriate compression technique for that field in subsequent packets by selecting a packet compression scheme from a plurality of packet compression schemes (step 810). For example, a field that is observed not to change from packet to packet can be elided from further compressed packets transmitted to the mobile station 12 and a field that is observed to change in say a linear fashion can be compressed using a technique appropriate for linearly varying fields. Appropriate compression techniques for each type of field behaviour will be known to those skilled in the art. Notifying the de-compressor 16 of the behaviour of a given field allows the de-compressor 16 to implement a complementary de-compression technique on that field in the compressed packets.

Referring now to FIG. 8, at connection set up, the compressor 15 will have no information on the behaviour of any of the fields in the packets. Thus, initially the received uncompressed packets will be sent to the mobile station 12 (steps 805 and 815). As information on field behaviour is developed by the profiler 17 by analyzing the uncompressed packets, generating a profile and providing the profile to the compressor 15 (steps 810, 820 and 825), the compressor 15 then begins to implement a compression scheme on the second or subsequently received packets, which initially will be quite a conservative scheme (steps 830 and 835). This scheme will be enhanced and refined and when the compressor 15 receives more information from the profiler 17, which receives second or subsequent packets, analyzes the packets, generates profile data and provides the profile data to the compressor 15 (steps 830, 845, 850 and 855). This allows the compressor 15 to implement appropriate compression techniques on more and more of the various fields.

Throughout the duration of the call connection between the base station 11 and the mobile station 12, the profiler 17 continues to analyse the behaviour of the packet fields in order to, if necessary, update the profile at the compressor 15 and also at the de-compressor 16. For instance, the profiler 17 may determine a better understanding of the behaviour of a given field, or determine that the behaviour pattern of a field has changed. In such instances, where the degree of compression is to be increased, for example if the profiler 17 has determined that a particular field is static, it is preferred to wait for this update to reach the de-compressor 16 and be acknowledged before the compressor 15 implements a refined compression scheme.

In other instances, the compressor 15 as a result of the profile generated by the profiler may be compressing packets to a greater degree then is correct. For example, the profiler 17 may have indicated to the compressor 15 that a field that had not changed for n packets is static, prompting the compressor 15 to compress that field accordingly, when subsequently the profiler 17 determines that the behaviour of that field has changed. Preferably, this change is signalled to the compressor 15 and de-compressor 16 immediately, to the de-compressor 16 using out-of band signalling or alternatively in-band signalling. For example, a profile update may be encoded as a number of additional bytes that are attached to a compressed packet sent to the mobile station 12. The same update may be persistently attached to different compressed packets until acknowledgement that the update has reached the compressor 15 is received.

Additionally, multiple types of encoding may be associated with a single field, to allow the profiler 17 to identify new types of field behaviour without necessarily overriding previously seen behaviour patterns. In order to allow the compressor 15 and de-compressor 16 to make use of this data, the profiler 17 may indicate to them the probabilities of the different encodings. Thus, for example, the profiler 17 may indicate that a field is static with high probability but has a small (non-zero) probability of changing. This should allow the compressor 15 and de-compressor 16 to manage slight deviations from expected behaviour without requiring large amounts of out-of band signalling.

In the above described example, it is assumed that the number of fields in each packet, their ordering, and the length of each field is known to the compressor 15 and the de-compressor 16, allowing the profiler 17 to analyse the packets on a field by field basis. In some instances, for example, if the communication involves a new data-type, associated with a new protocol stack, such information will not be available to these entities at connection set-up. In such instances, the profiler 17 is arranged to analyse received packets so as to identify behaviour patterns in equivalent sub-sections of the packets.

For example, as illustrated in FIG. 5 each whole packet may be treated simply as a string of octets and the profiler 17 arranged to examine successive packets looking for correlation between equivalent octets in the packets. Thus, without trying to identify field boundaries, the profiler 17 profiles the packet behaviour over time on an octet by octet basis. For example, the profiler 17 identifies octets that retain the same value, or that rarely change, or that take on a small number of values. As described above with respect to field behaviour, each time the profiler 17 identifies a pattern in the behaviour of a given octet this information is encoded and passed to the compressor 15 and de-compressor 16 which implement an appropriate compression/de-compression scheme accordingly.

As with the known field length example discussed above, throughout the duration of the call connection between the base station 11 and the mobile station 12, the profiler 17 continues to analyse the behaviour of the octets in order to update the profile at the compressor 15 and also at the de-compressor 16 as and when necessary.

It will be understood that profiling packet behaviour on an octet by octet basis is given by way of example only, and the profiler 17 could be configured to profile packet behaviour on the basis of packet sub-sections of any convenient size, for example 10 bits.

A further embodiment of the invention will now be described with reference to FIG. 6, in which components already described with respect to FIG. 2 are given similar reference numerals. In this embodiment, the profiler 17 rather than being located in the base station 11 is located in the mobile station 12. In operation, at connection set up, packets received at the base station 11 are initially transmitted to the mobile station 12 un-compressed. At the mobile station 12, the profiler 17 analyses received packets to determine the profile of the packets. As described above, if the frame format of the packets is known then the profiler 17 analyses the packets on a frame by frame basis. If the frame format is not known, then the profiler 17 analyses the packets on a sub-section by sub-section basis, for example octet by octet.

In either case, each time the profiler 17 determines the behaviour pattern of a given field or a given sub-section, this information is passed to the de-compressor 16 and is also transmitted from the mobile station 12 to the base station 11 where it is passed to the compressor 15. As in the examples described above, each time the profiler 17 notifies the compressor 15 of the behaviour of a given field or sub-section, the compressor is then able to use an appropriate compression technique for that field or sub-section in subsequent packets and the de-compressor is able to use an appropriate complementary de-compression technique on those packets when they are received. In this embodiment, the profiler 17 may be arranged to analyse received packets either before they are input to the de-compressor 16 or after they are output from the de-compressor 16.

A further embodiment of the invention is illustrated in FIG. 7 in which features already described with respect to FIGS. 2 and 6 are again given similar reference numerals. In this embodiment, both the base station 11 and the mobile station 12 are provided with their own profiler, indicated as 17a and 17b respectively. In operation, packets received at the base station 11 from the internet 14 are, as described hereinbefore, analysed by the profiler 17a to develop a profile of the behaviour of either fields in the packet or sub-sections of the packets. As before, the information on the behaviour of each field or sub section developed by the profiler 17a is sent to the compressor 15 which then implements appropriate compression techniques. Advantageously, in this embodiment, there is no need for the information determined by the profiler 17a to be sent from the base station 11 over the wireless interface 13 to the mobile station 12 for passing to the de-compressor 16. Instead, the profiler 17b performs its own analysis on packets received from the base station 11, to develop its own profile of the behaviour of either fields in the packet or sub-sections of the packets, which matches that developed by the profiler 17a. The information on the behaviour of each field or sub-section developed by the profiler 17b is sent to the de-compressor 16 which then implements appropriate de-compression techniques that are complementary to the compression techniques applied at the compressor 15.

Again, the compressor 15 will initially implement a conservative compression scheme with the initial packets transmitted to the mobile station 12 not being compressed. As before, the compression scheme implemented by the compressor 15 will be enhanced and refined as and when the compressor 15 receives information from the profiler 17a detailing the behaviour of the fields (or the sub-sections) of the packets. Advantageously, since the information on the field (or sub-section) behaviour required by the de-compressor 16 in order to de-compress packets, is generated locally by the second profiler 17b there is no requirement for this information to be signalled from the base-station 11 to the mobile station 12, thereby saving on bandwidth usage. It will be appreciated by those possessed of the appropriate skills that the two profilers 17a and 17b must be kept operating in synchronisation. This may be achieved, for example, by transmitting a regular synchronisation signal from the base station 11 to the mobile station 12 on a dedicated control channel It is to be understood that the invention has been described with reference to the Internet and a cellular mobile communications network for illustration only. The invention may find application in any communication system or combination of systems where it is desirable to compress data packets in a packet flow prior to the packets being received at a receiving station. For example, it is envisaged that the invention may find particular application in wireless local area networks.

Having thus described the present invention by reference to preferred embodiments it is to be well understood that the embodiments in question are exemplary only, and that modifications and variations such as will occur to those possessed of appropriate knowledge and skills may be made without departure from the scope of the invention as defined in the appended claims.

The invention claimed is:

1. A method of processing data packets in a data stream in a communication system, the method comprising:
   receiving a plurality of data packets from the data stream at a packet analyzer;
   analyzing, independent of stored records of profiles, the plurality of data packets to determine a manner of variation of a header field from data packet to data packet;
   generating, independent of the stored records of profiles, profile data which indicates the manner in which the header field varies from data packet to data packet; and
   presenting the profile data to a packet compressor for selecting a packet compression scheme from a plurality of packet compression schemes based on the profile data.

2. A method according to claim 1, wherein behavior of at least a portion of the header field from packet to packet is unknown when a connection for the data stream is initially setup.

3. A method according to claim 2, the method further comprising:
   receiving the profile data at the compressor,
   said compressor compressing data packets from the data stream, using said compression scheme.

4. A method according to claim 3, wherein the profile data is transmitted over a network link to the compressor.

5. A method according to claim 2, method further comprising:
   presenting the profile data to a packet de-compressor, whereby the de-compressor is enabled to implement a packet de-compression scheme based on the profile data.

6. A method according to claim the method further comprising:
   receiving the profile data at the de-compressor;
   said decompressor de-compressing data packets in the data steam, based on said decompression scheme.

7. A method according to claim 6, wherein the profile data is transmitted over a network link to the de-compressor.

8. A method according to claim 7, wherein the profile data is transmitted over a wireless interface to the de-compressor.

9. A method according to claim 7, wherein the profile data is encoded as a bit string and attached to a data for transmission to the de-compressor.

10. A method according to claim 2, wherein the profile data indicates that the header field of each packet either does not vary from packet to packet, varies linearly from packet to packet, or varies randomly from packet to packet.

11. A method according to claim 2, wherein the plurality of packet compression schemes includes at least one packet compression scheme in addition to static field compression.

12. An apparatus for processing data packets in a communication system, the apparatus comprising:
   a processor, the processor executing a computer program to receive a plurality of data packets from the data stream;
   analyze, independent of stored records of profiles, the plurality of data packets to determine a manner of variation of a header field from data packet to data packet;
   generate independent of stored records of profiles, profile data which indicates the manner in which the header field varies from data packet to data packet, and
   present the profile data to a packet compressor for selecting a data packet compression scheme from a plurality of packet compression schemes based on the profile data.

13. An apparatus according to claim 12, wherein behavior of at least a portion of the header field from packet to packet is unknown when a connection for the data stream is initially setup.

14. A method of processing data packets in a data stream in a communication system, the method comprising:
   transmitting a first set of uncompressed data packets;
   analyzing the first set of uncompressed data packets to determine the manner in which a header field of each of the data packets of the first set of uncompressed data packets varies from data packet to data packet;
   generating first profile data which indicates the manner in which the header field varies;
   providing the first profile data to a packet compressor;
   compressing, by the packet compressor, a second set of uncompressed packets using a first packet compression scheme based on the first profile data to produce a second set of compressed packets;
   transmitting the second set of compressed packets;
   analyzing the second set of uncompressed packets to determine the manner in which the header field of each of the data packets of the second set of data packets varies from data packet to data packet;
   generating second profile data which indicates the manner in which the header field of the first and second set of data packets varies;
   providing the second profile data to the packet compressor;
   compressing, by the packet compressor, a third set of uncompressed packets using a second packet compression scheme based on the second profile data to produce a third set of compressed packets; and
   transmitting the third set of compressed packets.

15. A method according to claim 14, method further comprising:

presenting the first and second profile data to a packet de-compressor, whereby the de-compressor is enabled to implement a first and second packet de-compression scheme based on the first and second profile data.

16. A method according to claim 14, wherein the first and second profile data are transmitted over a network link to the de-compressor.

17. A method according to claim 16, wherein the first and second profile data is encoded as a bit string and attached to a data packet for transmission to the de-compressor.

18. A method according to claim 14, wherein the first and second profile data indicates that the at least one corresponding part of each packet either does not vary from packet to packet, varies linearly from packet to packet, or varies randomly from packet to packet.

* * * * *